United States Patent
Yang et al.

(10) Patent No.: US 11,749,698 B2
(45) Date of Patent: Sep. 5, 2023

(54) IMAGE SENSOR

(71) Applicant: SK hynix Inc., Icheon-si (KR)

(72) Inventors: Yun Hui Yang, Cheongju-si (KR); Young Woong Do, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 193 days.

(21) Appl. No.: 16/890,925

(22) Filed: Jun. 2, 2020

(65) Prior Publication Data

US 2021/0118929 A1 Apr. 22, 2021

(30) Foreign Application Priority Data

Oct. 17, 2019 (KR) .......................... 10-2019-0129420

(51) Int. Cl.
*H01L 27/146* (2006.01)

(52) U.S. Cl.
CPC .... *H01L 27/14623* (2013.01); *H01L 27/1463* (2013.01); *H01L 27/14621* (2013.01); *H01L 27/14645* (2013.01)

(58) Field of Classification Search
CPC ......... H01L 27/14623; H01L 27/14621; H01L 27/1463; H01L 27/14645; H01L 27/14627; H01L 27/1462; H01L 27/14605; H01L 27/14625
See application file for complete search history.

(56) References Cited

U.S. PATENT DOCUMENTS

| 8,507,964 | B2 | 8/2013 | Nozaki et al. |
| 9,263,485 | B2* | 2/2016 | Furuta ................. H01L 27/1464 |
| 2014/0339606 | A1* | 11/2014 | Lin .................... H01L 27/14621 438/70 |
| 2021/0066358 | A1* | 3/2021 | Nakagawa ........ H01L 27/14636 |
| 2021/0066369 | A1* | 3/2021 | Do .................... H01L 27/14625 |
| 2021/0327939 | A1* | 10/2021 | Togo ................. H01L 27/14627 |
| 2022/0037387 | A1* | 2/2022 | Tsao .................... H01L 27/1463 |

FOREIGN PATENT DOCUMENTS

KR 10-2019-0057601 A 5/2019

* cited by examiner

*Primary Examiner* — Douglas W Owens
(74) *Attorney, Agent, or Firm* — Perkins Coie LLP

(57) ABSTRACT

An image sensor is provided to include: one or more first grid structures arranged in rows and columns of a pixel array including imaging pixels arranged in rows and columns, the first grid structures structured to separate the imaging pixels from one another and including a low refractive-index material or an air to provide an optical isolation between two adjacent imaging pixels; and a gap region disposed between the first grid structures and configured to physically isolate the first grid structures from each other, wherein the first grid structures comprise a first capping layer covering the low refractive-index material or the air.

21 Claims, 21 Drawing Sheets

IMAGE SENSOR

CROSS-REFERENCES TO RELATED APPLICATION

This patent document claims the priority and benefits of Korean application number 10-2019-0129420, filed on Oct. 17, 2019, which is incorporated herein by reference in its entirety.

TECHNICAL FIELD

The technology and implementations disclosed in this patent document generally relate to an image sensor including color filters.

BACKGROUND

Image sensors refer to devices for capturing light that is incident thereon to produce an image. Recently, with the development of computer industry and communication industry, the demand for enhanced image sensors has been increasing in various electronic devices such as smart phones, digital cameras, video game equipment, devices for use with IOT (Internet of Things), robots, security cameras and medical micro-cameras.

The image sensors may be roughly divided into CCD (Charge Coupled Device) image sensors and CMOS (Complementary Metal Oxide Semiconductor) image sensors. CCD image sensors have less noise and better image quality than CMOS image sensors. However, CMOS image sensors have a simpler and more convenient driving scheme, and thus may be preferred in some applications. Furthermore, CMOS image sensors may integrate a signal processing circuit in a single chip, making it easy to miniaturize the sensors for implementation in a product, with the added benefit of consuming low power. CMOS image sensors can be fabricated using a CMOS process technology, which results in low manufacturing cost. CMOS image sensing devices have been widely used due to their suitability for implementation in mobile devices.

SUMMARY

The disclosed technology relates to an image sensor which has an air grid structure that can maintain its stability in a situation where air pressure in the air grid structure increases.

In an embodiment, an image sensor may include: a plurality of first grids arranged in a row or column direction of a pixel array, and each including an air layer; and a gap region disposed between the first grids adjacent to each other among the plurality of first grids, and configured to physically isolate the air layers of the respective first grids. The first grid may include the air layer filled with air and a first capping layer covering the air layer.

In another aspect, an image sensor is provided to comprise: one or more first grid structures arranged in rows and columns of a pixel array including imaging pixels arranged in rows and columns, the first grid structures structured to separate the imaging pixels from one another and including a low refractive-index material or an air to provide an optical isolation between two adjacent imaging pixels; and a gap region disposed between the first grid structures and configured to physically isolate the first grid structures from each other, wherein the first grid structures comprise a first capping layer covering the low refractive-index material or the air.

In another aspect, an image sensor is provided to comprise: unit pixels arranged in rows and columns, each including a photosensing element and configured to generate electronic signals in response to a reception of light incident on each of unit pixels; a metal layer formed along boundaries of each of the unit pixels to surround unit pixels; and one or more structures disposed on the metal layer and spaced apart from one another, each of the one or more structure including a refractive-index material that has sufficiently low refractive-index to block light incident on a corresponding unit pixel from passing through toward neighboring unit pixels.

BRIEF DESCRIPTION OF THE DRAWINGS

FIGS. 10A to 10K are diagrams for describing a process of forming a grid structure in accordance with an embodiment.

DETAILED DESCRIPTION

Hereafter, various embodiments of the disclosed technology will be described with reference to the accompanying drawings. However, the disclosed technology is not limited to specific embodiments, but it should be understood that various modifications, equivalents and/or alternatives of the embodiments can be made.

Figure 1:
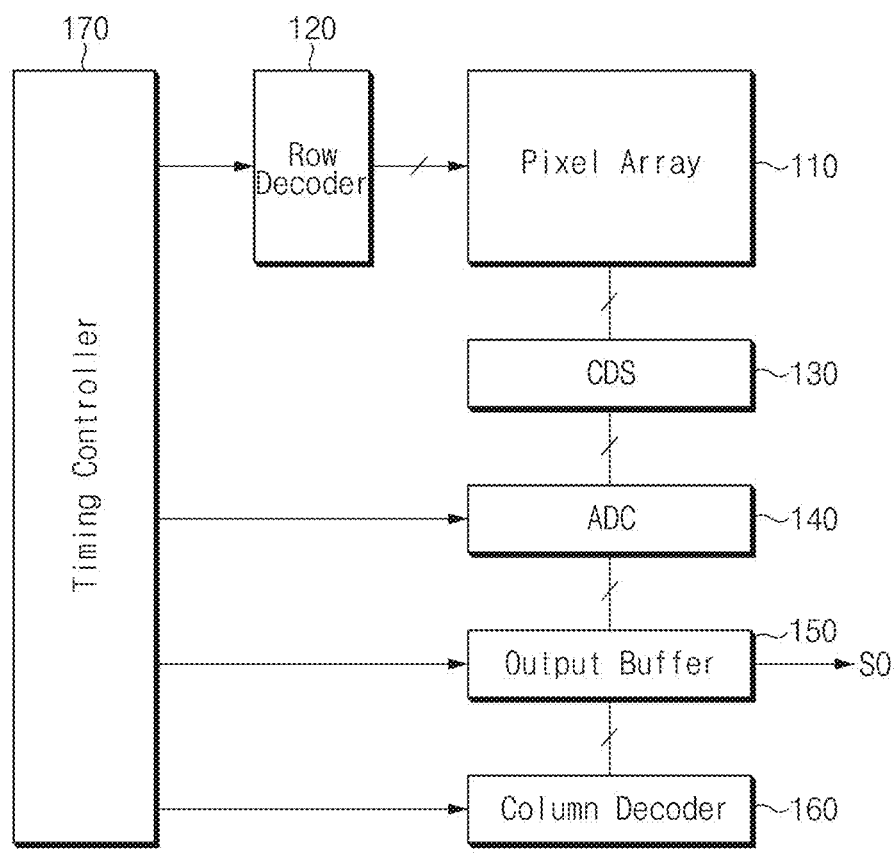
FIG. 1 is a block diagram illustrating an image sensor in accordance with an embodiment.

FIG. 1 is a block diagram illustrating an image sensor in accordance with an embodiment.

Referring to FIG. 1, the image sensor 100 may include a pixel array 110, a row decoder 120, a CDS (Correlate Double Sampler) 130, an ADC (Analog-Digital Converter) 140, an output buffer 150, a column decoder 160 and a timing controller 170. The components of the image sensor 100 are only examples, and some components may be added or at least some of the components may be omitted, if necessary.

The pixel array 110 may include a plurality of unit pixels arranged in a two-dimensional manner including rows and columns. Each unit pixel may convert a light signal into an electrical signal. In some implementations, each unit pixel has its own dedicated driver circuits. In some other implementations, at least two unit pixels form a shared pixel structure where the at least two unit pixels share at least one common driver circuit. The pixel array 110 may receive driving signals including a row selection signal, a pixel reset signal, a transmission signal, etc. from the row decoder 120 and be operated by the driving signal received from the row decoder 120.

The row decoder 120 may be used to select desired rows of the pixel array 10 based on control signals generated by the timing controller 170. The row decoder 120 may select one or more rows of the pixel array 110. The row decoder 120 may generate the row select signal to select one or more rows among a plurality of rows. Then, the row decoder 120 may sequentially enable the pixel reset signal and the transmission signal for pixels corresponding to the selected one or more rows. Therefore, analog reference signals and image signals which are generated by the pixels of the selected one or more rows, respectively, may be sequentially transferred to the CDS 130. The reference signal and the image signal may be collectively referred to as a pixel signal.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS 130 may sequentially sample and hold the reference signals and the image signals which are provided to a plurality of column lines, respectively, from the pixel array 110. That is, the CDS 130 may sample and hold voltage levels of the reference signals and the image signals corresponding to the respective columns of the pixel array 110.

The CDS 130 may transfer the reference signals and the image signals of the respective columns as CDS (Correlate Double Sampling) signals to the ADC 140 under control of the timing controller 170.

The ADC block is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may convert the CDS signals for the respective columns, outputted from the CDS 130, into digital signals and output the digital signals. In some implementations, the ADC 400 samples an input signal (e.g., pixel signal) multiple times using the reference signal and analog-to-digital convert the sampled input signals by counting the number of clock pulses until crossing points. The ADC 140 may perform such counting operation and a computing operation based on the CDS signals for the respective columns and a ramp signal provided from the timing controller 170, thereby generating digital image data from which noise corresponding to the respective columns (for example, unique reset noise of the pixels) is removed.

The ADC 140 may include a plurality of column counters corresponding to the respective columns of the pixel array 110, and generate image data by converting the CDS signals corresponding to the respective columns into digital signals using the column counters. In accordance with another embodiment, the ADC 140 may include one global counter, and convert the CDS signals corresponding to the respective columns into digital signals using a global code provided from the global counter.

The output buffer 150 may capture the image data which are provided on a column basis from the ADC 140, and output the captured image data. The output buffer 150 may temporarily store the image data outputted from the ADC 140 under control of the timing controller 170. The output buffer 150 may operate as an interface that compensates for data rate difference or transmission (Tx) speed difference between the image sensor 100 and another device coupled to the image sensor 100.

The column decoder 160 may be used to select a column of the output buffer 150 under control of the timing controller 170, such that the image data temporarily stored in the selected column of the output buffer 150 are sequentially outputted. In some implementations, the column decoder 160 may receive an address signal from the timing controller 170, generate a column select signal based on the address signal, and select a column of the output buffer 150 to output image data as an output signal SO from the selected column of the output buffer 150.

The timing controller 170 may control the row decoder 120, the ADC 140, the output buffer 150 and the column decoder 160.

The timing controller 170 may transmit various signals to the row decoder 120, the column decoder 160, the ADC 140 and the output buffer 150, which include a clock signal for operating or synchronizing the respective components of the image sensor 100, a control signal for timing control, and address signals required for selecting a row or column. In an embodiment, the timing controller 170 may include a logic control circuit, a PLL (Phase Locked Loop) circuit, a timing control circuit, a communication interface circuit, or others.

Figure 2A:
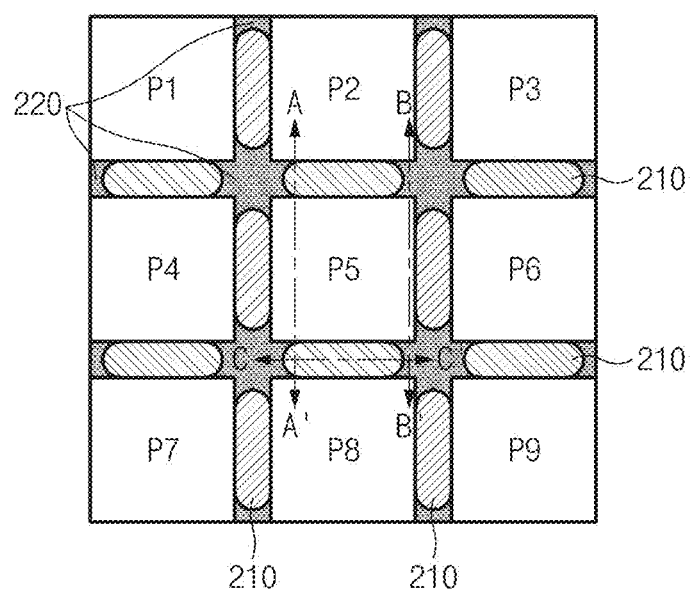
FIG. 2A is a diagram illustrating an embodiment of a pixel array illustrated in FIG. 1.

FIG. 2A is a diagram illustrating an embodiment of the pixel array illustrated in FIG. 1.

Referring to FIG. 2A, a pixel array 110-1A may include nine unit pixels P1 to P9 arranged in a 3×3 matrix. Each of the unit pixels P1 to P9 may indicate a light receiving region on which light is incident. For convenience of description, FIG. 2A illustrates only nine unit pixels P1 to P9, but the number of unit pixels included in the pixel array 110-1A is not limited to nine. For example, the pixel array 110-1A can include unit pixels arranged in a matrix including M rows and N columns, where M and N are positive integers.

Between the unit pixels P1 to P9, first grids 210 are provided to optically isolate or separate adjacent unit pixels. The first grid 210 may include material having a relatively low refractive index to block light from passing through toward neighboring pixels. In some implementations, the first grid 210 may include an air layer that includes or is filled with air. In some implementations, the first grid 210 may have a double layered structure including an air layer and a metal layer including a metal such as tungsten.

The first grids 210 may be arranged between adjacent unit pixels along a row direction (a horizontal direction) and/or a column direction (a vertical direction). In some implementations, the unit pixel and the corresponding first grid that is arranged on a side of the unit pixel can be considered to form a pixel structure together. In this case, the first grid is a part of the pixel structure rather than a separate structure arranged outside the pixel structure.

The first grid 210 may extend along a row direction or a column direction. The first grid 210 extending along a side of a unit pixel may have a length equal to or less than that of the side of the unit pixel.

The first grids 210 disposed in the pixel array 110-1A may be spaced apart from one another.

In the plan view as shown in FIG. 2A, each of the first grids 210 may have a surface with a rounded rectangular shape in which corners of a rectangular are rounded. The rounded portions of the first grid 210 may correspond to two opposite end portions of the first grid 210 along a direction in which the first grid 210 extends. This round shape is more suitable than the rectangular shape for distributing or relieving stress which is generated in the air layer of the first grid 210 due to high temperature, and thus securing tolerance to high temperature. In another embodiment, other portions than those as shown in FIG. 2A of the first grid 210 can be rounded.

In the plan view as shown in FIG. 2A, gap regions 220 are provided in a portion of the pixel array 110-1A where the first grids 210 and the unit pixels are not disposed. In some implementations, the gap regions 220 may include a central gap region arranged at or near a center of (2×2) matrix of the unit pixels and peripheral gap regions disposed along any peripheral border of the pixel array 110-1A. In some implementations, the gap regions 220 may include a first extension region connecting adjacent first grids 210 along the row direction and a second extension region connecting adjacent first grids 210 along the column direction. Unlike the first grids 210, no air layer is disposed in the gap regions 220. In some implementations, the gap regions 220 include a second grid including a metal layer. The gap regions 220 may be disposed between the first grids 210 which are arranged in the row and column direction of the pixel array 110-1A. The gap regions operate to physically isolate the air layers of adjacent first grids 210 from each other.

The more detailed structure of the unit pixel array including the first grids 210 and the gap regions 220 will be described later with reference to FIGS. 5, 6 and 7.

Figure 2B:
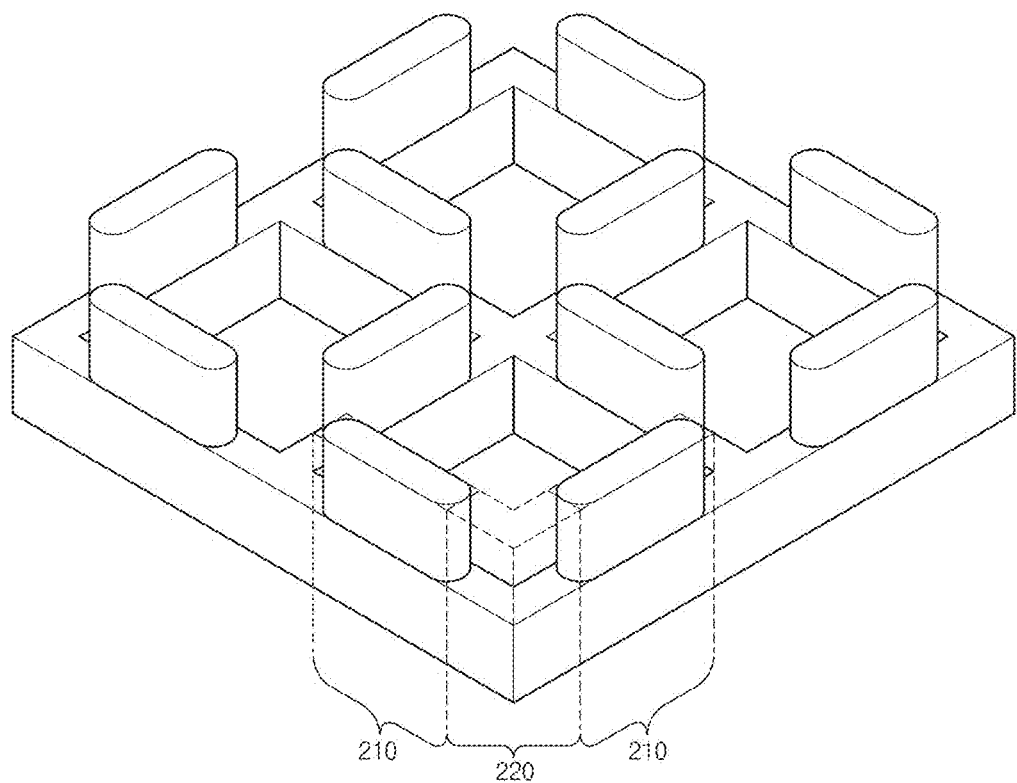
FIG. 2B is a perspective view of the pixel array illustrated in FIG. 2A.

FIG. 2B is a perspective view of the pixel array illustrated in FIG. 2A.

FIG. 2B illustrates a pixel array 110-1B in which a second grid including a metal layer is disposed in the gap region 220.

The first grid 210 may have a stacked structure including an air layer at the top and the metal layer at the bottom. The gap region 220 may include the second grid including the metal layer only at the bottom without any air layer at the top. Thus, the gap region 220 may physically isolate the air layers of adjacent first grids 210.

Figure 3:
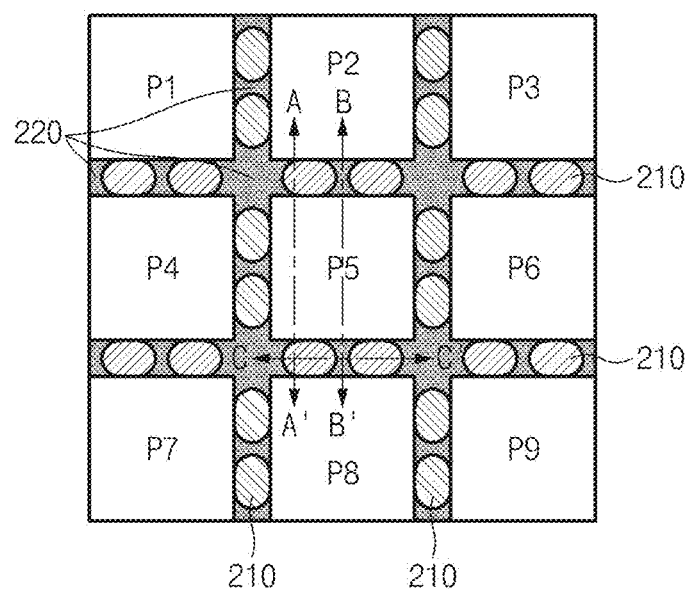
FIG. 3 is a diagram illustrating another embodiment of the pixel array illustrated in FIG. 1.

FIG. 3 is a diagram illustrating another embodiment of the pixel array illustrated in FIG. 1.

Referring to FIG. 3, a pixel array 110-2 may include nine unit pixels P1 to P9 arranged in a 3×3 matrix. For convenience of description, FIG. 3 illustrates only nine unit pixels P1 to P9, but the number of unit pixels included in the pixel array 110-2 is not limited to nine. For example, the pixel array 110-2 can include unit pixels arranged in a matrix of M rows and N columns, where M and N are positive integers.

Between the unit pixels P1 to P9, first grids 210 are provided to optically isolate or separate adjacent unit pixels. The first grid 210 may include material having a relatively low refractive index to block light from passing through toward neighboring pixels. In some implementations, the first grid 210 may include an air layer that includes or is filled with air. In some implementations, the first grid 210 may have a double layered structure including an air layer and a metal layer including a metal such as tungsten.

The first grids 210 may be arranged between adjacent unit pixels along a row direction (a horizontal direction) and/or a column direction (a vertical direction). In some implementations, the unit pixel and the corresponding first grid that is arranged on a side of the unit pixel can be considered to form a pixel structure together. In this case, the first grid is a part of the pixel structure rather than a separate structure arranged outside the pixel structure.

The first grid 210 may extended along a row direction or a column direction. As illustrated in FIG. 3, two first grids 210, which are separated from each other, may be disposed on one side of a unit pixel. Although the embodiment as shown in FIG. 3 shows two separated first grids 210 disposed on one side of the unit pixel, other implementations are also possible. For example, three or more first grids 210 can be disposed on one side of the unit pixel. Thus, unlike the implementation shown in FIG. 2A, two or more first grids 210 can be disposed on one side of the unit pixel.

The first grid 210 of FIG. 3 may have a length equal to or less than that of one side of the corresponding unit pixel. The distance between the first grids 210 that are disposed on one side of the unit pixel may be experimentally decided such that an optical crosstalk performance does not degrade and the shape of the first grid 210 is stably maintained during a fabrication process and during an operation of the image sensor.

The first grids 210 disposed in the pixel array 110-2 are disposed apart from each other. For example, in the pixel array arranged in a 2×2 matrix, the first grids 210 are disposed horizontally and vertically around the center of the 2×2 pixel array and those first grids 210 are spaced apart from each other.

In the plan view as shown in FIG. 3, each of the first grids 210 may have a surface with a rounded rectangular shape in which corners of a rectangular are rounded. The rounded portions of the first grid 210 may correspond to two opposite end portions of the first grid 210 along a direction in which the first grid extends. This round shape is more suitable than the rectangular shape for distributing or relieving stress which is generated in the air layer included in the first grid 210 due to high temperature, and thus securing tolerance to high temperature. In some embodiments, other portions than those as shown in FIG. 2A can be rounded.

The gap region 220 may have no air layer disposed therein. In some embodiment, a second grid including a metal layer may be disposed in the gap region 220.

Figure 4:
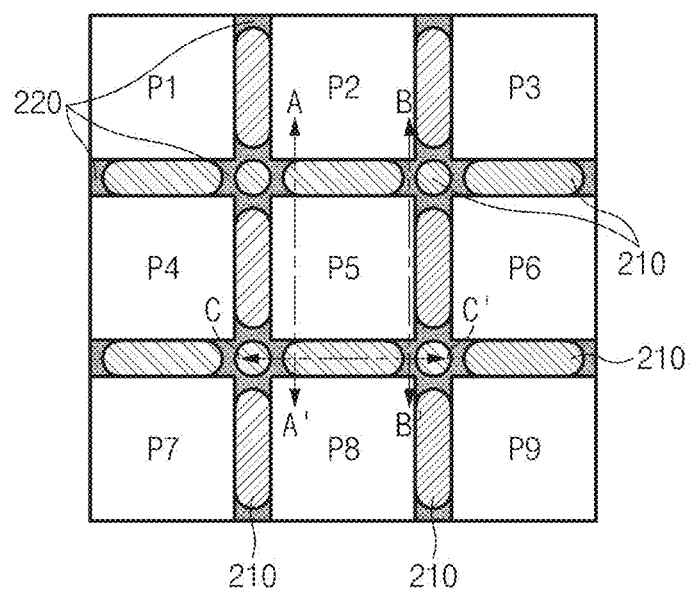
FIG. 4 is a diagram illustrating still another embodiment of the pixel array illustrated in FIG. 1.

FIG. 4 is a diagram illustrating an embodiment of a pixel array illustrated in FIG. 1.

Referring to FIG. 4, a pixel array 110-3 may include nine unit pixels P1 to P9 arranged in a 3×3 matrix. Each of the unit pixels P1 to P9 may indicate a light receiving region on which light is incident. For convenience of description, FIG. 4 illustrates only nine unit pixels P1 to P9, but the number of unit pixels included in the pixel array 110 is not limited to nine. For example, the pixel array 110-3 can include unit pixels arranged in a matrix of M rows and N columns, wherein M and N are positive integers.

Between the unit pixels P1 to P9, first grids 210 are provided to optically isolate or separate adjacent unit pixels. The first grid 210 may include material having a relatively low refractive index to block light from passing through toward neighboring pixels. In some implementations, the first grid 210 may include an air layer that includes or is filled with air. In some embodiments, the first grid 210 may have a double layered structure including an air layer and a metal layer including a metal such as tungsten.

The first grids 210 may be arranged between adjacent unit pixels along a row direction (a horizontal direction) and/or a column direction (a vertical direction). In some implementations, the unit pixel and the corresponding first grid that is arranged on a side of the unit pixel can be considered to form a pixel structure together. In this case, the first grid is a part of the pixel structure rather than a separate structure arranged outside the pixel structure. The first grid 210 may extend along one side of the unit pixel abutting the first grid 210.

In the implementation as shown in FIG. 4, unlike implementations FIGS. 2A and 3, the first grid 210 may be additionally disposed in the center of the unit pixels disposed in a 2×2 matrix. In FIG. 4, the first grid 210 disposed in the center of the unit pixels disposed in a 2×2 matrix has a circular shape. However, the present embodiment is not limited thereto, but the first grid 210 may have various figure shapes such as rectangle or octagon other than a circle.

The first grid 210 of FIG. 4 may have a length equal to or less than that of one side of the corresponding unit pixel. The first grids 210 are disposed in the center of the unit pixels disposed in a 2×2 matrix (for example, P1, P2, P4 and P5). The first grids 210 disposed in the pixel array 110-3 are disposed apart from one another. For example, in the pixel array arranged in a 2×2 matrix, the first grids 210 are disposed horizontally and vertically around the center of the 2×2 pixel array and those first girds 210 are spaced apart from one another. Furthermore, the distance between the first grids 210 adjacent to each other may be experimentally decided such that an optical crosstalk performance does not degrade and the shape of the first grid 210 is stably maintained during a fabrication process and during an operation of the image sensor.

In the plan view as shown in FIG. 4, each of the first grids 210 may have a a surface with a rounded rectangular shape in which corners of a rectangular are rounded. The rounded portions of the first grid 210 may correspond to two opposite end portions of the first grid 210 along a direction in which the first grid 210 extends. This round shape is more suitable than the rectangular shape for distributing or relieving stress which is generated in the air layer included in the first grid 210 due to high temperature, and thus securing tolerance to high temperature. In some embodiments, other portions than those as shown in FIG. 2A of the first grids can be rounded.

The gap region 220 may have no air layer disposed therein. In some embodiments, a second grid including a metal layer may be disposed in the gap region 220.

In some implementations, the structure described with reference to FIG. 3 and the structure described with reference to FIG. 4 can be combined together.

Hereafter, features which can be commonly applied to the first grids 210 of FIGS. 2A, 3 and 4 will be described.

Typically, a lens module (not illustrated) is disposed over the image sensor 100, and a main incident angle of incident light passing through the lens module (not illustrated) may be different in the row direction and the column direction. In this case, the first grids arranged in the row direction and the first grids arranged in the column direction may be fabricated in different shapes. The incident angle may indicate an incident angle with respect to the plane of the pixel array 110.

The first grids included in the pixel array 110 may be divided into the first grids disposed adjacent to the center of the pixel array 110 and the first grids disposed adjacent to the edge of the pixel array.

The main incident angle of incident light passing through the lens module (not illustrated) may be different around the center and edge of the pixel array 110. In this case, the first grids disposed adjacent to the center of the pixel array 110 and the first grids disposed adjacent to the edge of the pixel array 110 may be fabricated in different shapes.

When the shapes of the first grids are referred to as being different in the above descriptions, it may indicate that one or more of the width, length, and height of any one first grid are different from those of another first grid. Alternatively, when the shapes of the first grids are referred to as being different, it may indicate that the shape of any one of the first grids (ex. clamp shape) is different from the shape of another first grid.

The different shapes of the first grids may be decided as the optimal shapes in consideration of the main incident angle of incident light passing through the lens module (not illustrated), information on whether optical crosstalk is degraded, and reduction in light detection efficiency.

Figure 5:
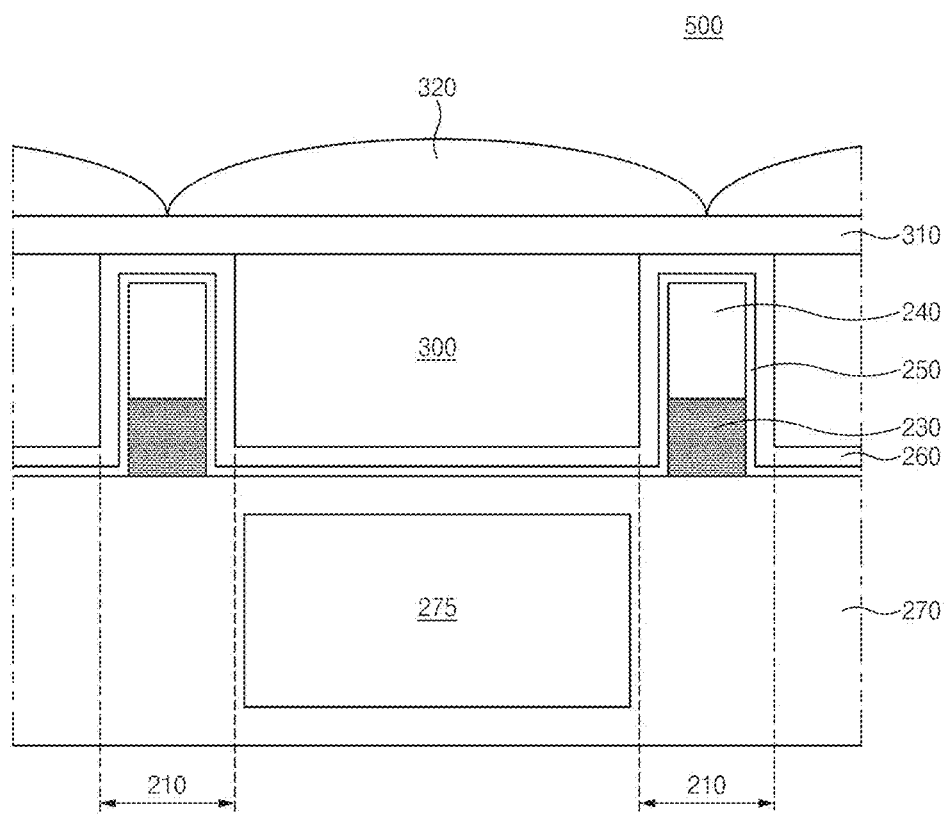
FIG. 5 is a diagram illustrating an embodiment of a cross-section taken along a first cutting line illustrated in FIGS. 2A, 3 and 4.

FIG. 5 is a diagram illustrating an embodiment of a cross-section taken along a line A-A' of FIGS. 2A, 3 and 4.

In FIG. 5, the cross section of the fifth pixel P5 is mainly discussed with the first grids 210 disposed on sides of the fifth pixel P5. The following descriptions, however, can be applied to other unit pixels included in the pixel array 110.

The cross-section structure 500 in FIG. 5 includes a substrate 270, a photodiode 275, a metal layer 230, an air layer 240, a first capping layer 250, a second capping layer 260, a color filter 300, an over coating layer 310 and a micro lens 320. Although the photodiode 275 is shown in FIG. 5, any photosensing elements can be implemented to generate photocharges in response to light. For example, the photosensing elements include photodiodes, photogates, phototransistors, photoconductors, or some other photosensitive structures capable of generating photocharges.

The substrate 270 may include top and bottom surfaces facing each other. The bottom and top surfaces of the substrate 270 may correspond to a front side and a back side of the substrate, respectively, but other implementations are also possible. In some implementations, the substrate 270 may include a P-type or N-type bulk substrate. In some implementations, the substrate 270 may include a substrate in which a P-type or N-type epitaxial layer grown on a P-type bulk substrate or N-type bulk substrate.

The photodiode 275 of the fifth pixel P5 may be disposed in the substrate 270. The photodiode 275 may be formed as an N-type doping region through an ion implantation process for implanting N-type ions. In an embodiment, the photodiode 275 may include a plurality of doping regions stacked therein. In this case, a lower doping region may be formed by implanting N+ ions, and an upper doping region may be formed by implanting N− ions. The photodiode 275 may be formed across the substrate 270 as wide as possible, in order to increase a fill factor indicating light detection efficiency. In an embodiment, an isolation layer (not illustrated) may be formed between the photodiodes of the pixels adjacent to each other, and have a vertical deep trench structure for electrical isolation and optical isolation.

The metal layer 230 may be disposed on the substrate 270. The metal layer 230 may be formed of or include a metallic material (ex. tungsten) having a high light absorption rate. In an embodiment, the metal layer 230 may include different materials stacked therein.

The air layer 240 may be disposed on the metal layer 230, and the shape of the air layer 240 may be defined by the first capping layer 250. The air layer 240 may be filled with or include air having a relatively low refractive index (for example, 1).

The first capping layer 250 may be formed to cover the air layer 240 and the metal layer 230. The first capping layer 250 may be formed in contact with the side surfaces of the air layer 240 and the metal layer 230 and the top surface of the air layer 240. Therefore, the air layer 240 and the metal layer 230 may be physically isolated from the outside by the first capping layer 250. For example, the first capping layer 250 may be formed of or include ULTO (Ultra Low Temperature Oxide) such as silicon oxide ($SiO_2$).

The second capping layer 260 may be formed to cover the first capping layer 250. The second capping layer 260 may be in contact with the first capping layer 250. The second capping layer 260 is located as the outermost element of the first grid 210. Thus, the first capping layer 250 may be physically isolated from the outside by the second capping layer 260. For example, the second capping layer 260 may be or include a dielectric layer including one or more of silicon oxynitride ($Si_xO_yN_z$), silicon oxide ($Si_xO_y$) and silicon nitride ($Si_xN_y$) where x, y and z are natural numbers.

The second capping layer 260 may have a larger thickness than the first capping layer 250. This is because the first capping layer 250 is formed as thin as possible to effectively discharge an internal material to the outside during a plasma process which will be described below, and the second capping layer 260 is formed to have a thickness required for stably maintaining the shape of the first grid 210 including the air layer 240.

In some embodiments, a support layer for maintaining the shape of the first grid 210 may be formed in regions corresponding to the bottom of the first capping layer 250 and the top of the air layer 240. The support layer may be or include a dielectric layer having no light absorption characteristic.

In an embodiment, the first capping layer 250 and the second capping layer 260 may be formed of or include the same material, and thus have the same refractive index.

In an embodiment, the refractive index of the first and second capping layers 250 and 260 may be higher than that of the air layer 240 and lower than that of the color filter 300.

The first grid 210 may prevent light incident on the color filter 300 from propagating toward another color filter adjacent to the color filter 300, thereby minimizing optical crosstalk.

Specifically, since the refractive index (e.g., 1) of the air layer 240 is lower than the refractive index (e.g., 1.6 to 1.7) of the color filter (not illustrated) and the refractive index (e.g., 1.4) of the first and second capping layers 250 and 260, the air layer 240 may block light from passing through toward neighboring pixels.

Whether light is reflected at the boundary of the air layer 240 may depend on an incident angle of the light, and thus a portion of the light at a certain incident angle may not be reflected and instead refracted toward the inside of the air layer 240. Even in this case, however, the portion of the light is absorbed by the metal layer 230. Thus, the light does not propagate toward another pixel and thus prevent optical crosstalk.

As illustrated in FIG. 5, the height of the top surface of the color filter 300 may be equal to the height of the first grid 210. However, other implementations are also possible. For example, the height of the top surface of the color filter 300 may be larger or smaller than the height of the first grid 210.

Although FIG. 5 illustrates that the first grid 210 has a double layered structure in which the metal layer 230 and the air layer 240 are stacked, the first grid 210 may have a single structure including only the air layer 240 without the metal layer 230.

The first and second capping layers 250 and 260 constituting the first grid 210 may be disposed on one side of the color filter 300. The first and second capping layers 250 and 260 can be disposed outside the first grid 210, for example, under the color filter (e.g., between the color filter 300 and the substrate 270). The first and second capping layers 250 and 260 disposed under the color filter 300 may extend from the first and second capping layers 250 and 260 of the first grid 210. Thus, the first and second capping layers 250 and 260 of the first grid 210 may be integrated with the first and second capping layers 250 and 260 disposed under the color filter 300.

Therefore, as compared to a case when the first and second capping layers 250 and 260 are disposed only in the first grid 210, by disposing the first and second capping layers 250 and 260 under the color filter 300, the first and second capping layers 250 and 260 can occupy a wider area in the image sensor and contact with an additional component (for example, the substrate 270) of the image sensor. Since the first and second capping layers 250 and 260 are configured to maintain the shape of the first grid 210, it is possible to improve the shape stability of the first grid 210 by including the first and second capping layers 250 and 260 in a wider area of the image sensor. Furthermore, the balance between tensions generated by the first and second capping layers 250 and 260 disposed under the color filter 300 on both sides of the first grid 210 can prevent the first grid 210 with a relatively small width from tilting to the left or right side.

The first and second capping layers 250 and 260 disposed under the color filter 300 may function as an anti-reflection layer that compensates for a difference in refractive index between the color filter 300 and the substrate 270 such that light passing through the color filter 300 can be effectively incident on the photodiode 275 in the substrate 270. Therefore, it is possible to omit a separate anti-reflection layer between the color filter 300 and the substrate 270, which reduces the total thickness of the unit pixel.

The color filter 300 may be formed over the substrate 270, and selectively transmit a specific wavelength range of light (for example, red, green, blue, magenta, yellow or cyan). In an embodiment, the color filter 300 may be omitted or replaced with an infrared pass filter when the unit pixel P5 corresponds to a depth pixel.

The over coating layer 310 may be disposed over the color filter 300 and the first grid 210, and prevent diffused reflection of light incident from outside, thereby suppressing flare. Furthermore, the over coating layer 310 may compensate for a level difference between the color filter 300 and the first grid 210, such that the micro lens 320 can have a constant height.

The microlens 320, which is used to improve the sensitivity of the photodiode of the unit pixel by converging incident light onto the photodiode, may be disposed over the color filter. A substrate that includes such photodiode may be disposed below the color filter. The micro lens 320 may be formed over the over coating layer 310, and configured to increase light gathering power for incident light, thereby improving the light detection efficiency of the photodiode 275.

Figure 6:
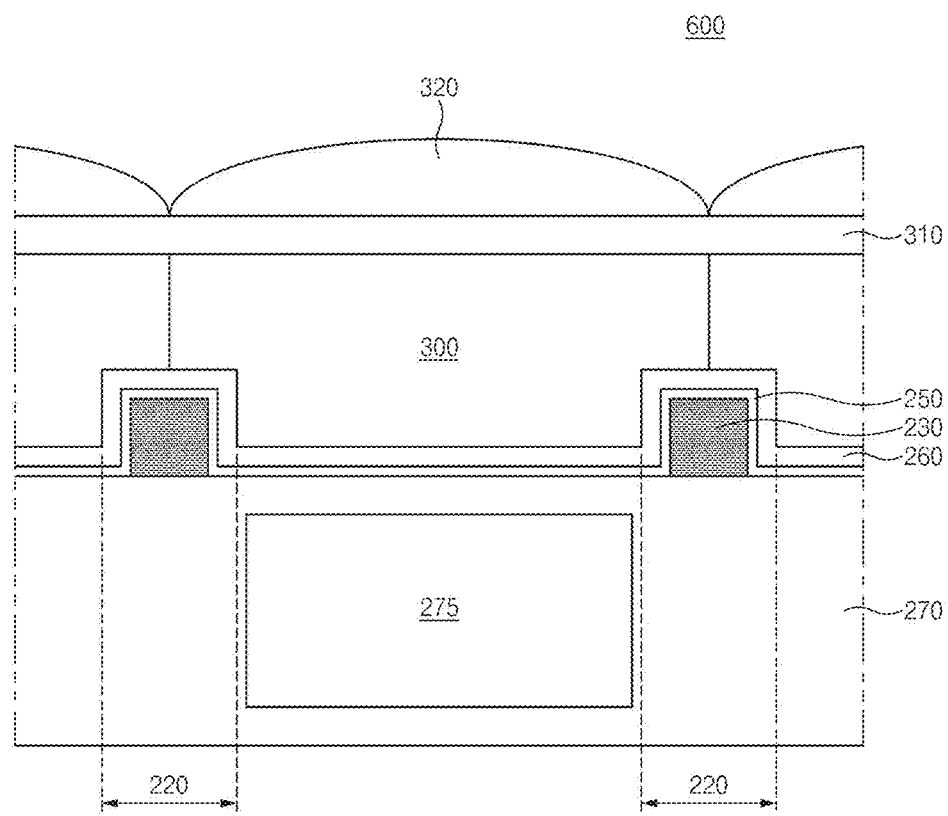
FIG. 6 is a diagram illustrating an embodiment of a cross-section taken along a second cutting line illustrated in FIGS. 2A, 3 and 4.

FIG. 6 is a diagram illustrating an embodiment of a cross-section taken along the line of FIGS. 2A, 3 and 4.

In FIG. 6, the cross-section structure 600 including the second grids 220 disposed on sides of the fifth pixel P5 is mainly discussed. The following descriptions, however, can be applied to other unit pixels included in the pixel array 110.

The cross-section structure 600 of the image sensor includes the substrate 270, the photodiode 275, the metal layer 230, the first capping layer 250, the second capping layer 260, the color filter 300, the over coating layer 310 and the micro lens 320.

Unlike the first grid 210, the gap region 220 includes the metal layer 230 without the air layer 240.

In some implementations, when the first grid 210 has a structure including only the air layer 240 without the metal layer 230, the gap region 220 may not include the metal layer 230. For example, the gap region 220 may have a structure in which the first capping layer 250 and the second capping layer 260 are sequentially stacked without the metal layer 230 on the substrate 270.

In accordance with still another embodiment, even when the first grid 210 has a structure including only the air layer 240 without the metal layer 230, the gap region 220 may include the metal layer 230.

The boundary between the color filters 300 of different unit pixels (e.g., P2 and P5) may be located over the gap region 220.

Figure 7:
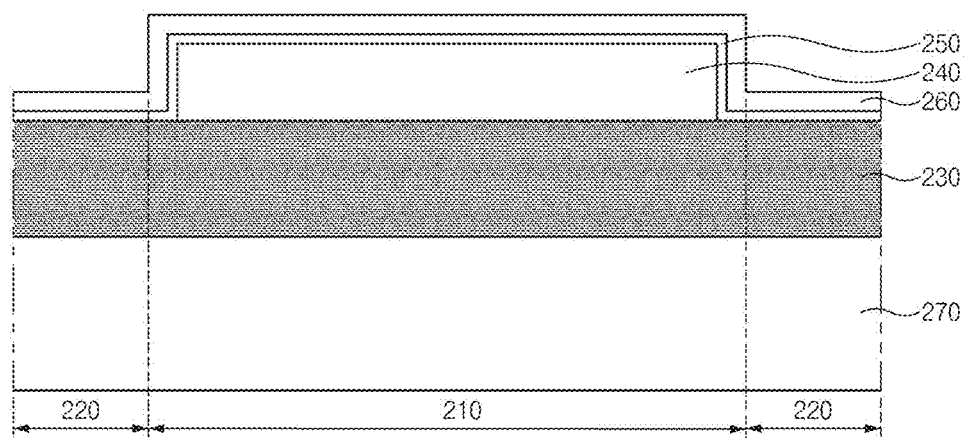
FIG. 7 is a diagram illustrating an embodiment of a cross-section taken along a third cutting line illustrated in FIG. 2A.

FIG. 7 is a diagram illustrating an embodiment of a cross-section taken along the third cutting line C-C' of FIG. 2A.

In FIG. 7, the cross-section structure 700 including a region between the fifth pixel P5 and the eighth pixel P8 is mainly discussed. The following descriptions, however, can be applied to regions between other unit pixels included in the pixel array 110.

The cross-section structure 700 of the image sensor includes the substrate 270, the metal layer 230, the air layer 240, the first capping layer 250 and the second capping layer 260. In addition, the cross-section structure 700 of the image sensor may further include the color filter 300, the over coating layer 310 and the micro lens 320 which have been described with reference to FIG. 5, which are omitted in FIG. 7.

The first grid 210 may be extended along one side of the unit pixel P5 or P8 abutting the first grid 210. The first grid 210 extended along one side of the unit pixel may have a length equal to or less than that of the side of the corresponding unit pixel.

The air layer 240 of the first grid 210 may be physically isolated from another first grid 210 by the gap regions 220 disposed on the left and right sides of the first grid 210. The gap region 220 may include the metal layer 230 and the first and second capping layers 250 and 260 that are sequentially stacked on the metal layer 230 while the air layer 240 is omitted in the gap region 220. Thus, the gap region 220 may be referred to as a second grid and the second grid includes the metal layer 230.

In some implementations, each of the first grid 210 and the gap region 220 may not include the metal layer 230. For example, the gap region 220 may have a structure in which the first capping layer 250 and the second capping layer 260 are sequentially stacked without the metal layer 230 on the substrate 270.

As a comparative example, let's assume that, unlike the structure illustrated in FIG. 7, the gap region 220 may include a same structure as the first grid 210 which includes stacked structure of the metal layer and the air layer. Thus, the pixel array 110 includes the air layers that are disposed in the gap region 220 as well as the first grid. In some implementations, the pixel array 110 may form a mesh-type structure in which air layers of the pixel array 110 are connected as one region between adjacent unit pixels along a row direction and a column direction.

In this case, since the first and second capping layers 250 and 260 have a thin film shape, a weak point may be present at certain portions of the first and second capping layers 250 and 260. The position of the weak point may depend on various factors of the fabrication process (e.g., limitations on the fabrication process, conditions of use such as high temperature condition). At this time, the pressure applied to the weak point increases as the temperature and volume of the air within the air layer 240 increase, which causes the first and second capping layers 250 and 260 to be damaged. When air layers are connected as one region in the pixel array 110, the amount of the pressure applied to the weak point corresponds to the volume of the entire air layers of the pixel array 110. Thus, the weak point may be easily damaged.

The grid structure as suggested by the disclosed technology, however, is designed such that the air layer 240 of the first grid 210 is physically separated by the gap region 220 which does not include the air layer 240. In some implementations, the air layer 240 of the first grid 210 is physically separated into predetermined units (e.g., one unit per side of each unit pixel). Therefore, the amount of pressure applied to the weak point of the first and second capping layers 250 and 260 can be reduced to the volume of one separated unit of the air layer 240 of the first grid 210 instead of the volume of the entire air layers included in the pixel array 110. Thus, the pressure applied to the weak point of the first and second capping layers 250 and 260 can be distributed, which makes it possible to effectively prevent the occurrence of the damage of the weak point.

Figure 8:
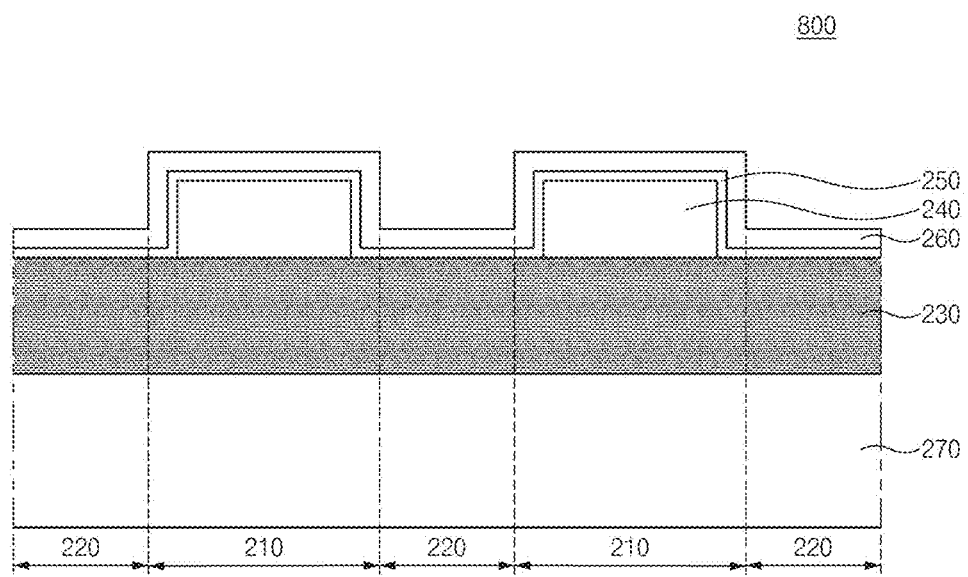
FIG. 8 is a diagram illustrating an embodiment of a cross-section taken along a third cutting line illustrated in FIG. 3.

FIG. 8 is a diagram illustrating an embodiment of a cross-section taken along the line C-C' of FIG. 3.

The cross-section structure 800 of the image sensor includes a region between the fifth pixel P5 and the eighth pixel P8. The following descriptions, however, can be applied to regions between other unit pixels included in the pixel array 110.

The cross-section structure 800 of the image sensor may include the substrate 270, the metal layer 230, the air layer 240, the first capping layer 250 and the second capping layer 260. In addition, the cross-section 800 may further include the color filter 300, the over coating layer 310 and the micro lens 320, which have been described with reference to FIG. 5. The color filter 300, the over coating layer 310 and the micro lens 320 are omitted in FIG. 8.

The first grid 210 may be extended along one side of the unit pixel P5 or P8 abutting the first grid 210. Unlike in FIG. 7, however, two first grids 210 which are physically independent of each other may be disposed on one side of the unit pixel. The sum of the lengths of the first grids 210 may be equal to or less than the length of one side of the corresponding unit pixel.

The air layer 240 of the first grid 210 may be physically isolated from another first grid 210 by the gap regions 220 disposed on the left and right sides of the first grid 210. The gap region 220 may include the metal layer 230 and the first and second capping layers 250 and 260 that are sequentially stacked on the metal layer 230 while the air layer 240 is omitted in the gap region 220. Thus, the gap region 220 may be referred to as a second grid and the second grid includes the metal layer 230.

In some implementations, each of the first grid 210 and the gap region 220 may not include the metal layer 230.

The air layer 240 of the first grid 210 illustrated in FIG. 8 is physically separated into predetermined units (for example, two units per side of unit pixel) by the gap region 220 which does not include the air layer 240. Therefore, the amount of pressure applied to the weak point of the first and second capping layers 250 and 260 can be reduced to the volume of one separated air layer 240 of the first grid 210 instead of the volume of the entire air layers included in the pixel array 110. Thus, the pressure applied to the weak point can be distributed to effectively prevent popping at the weak point. Thus, the pressure applied to the weak point of the first grid 210 illustrated in FIG. 8 can be smaller than the pressure applied to the weak point of the first grid 210 illustrated in FIG. 7.

Figure 9:
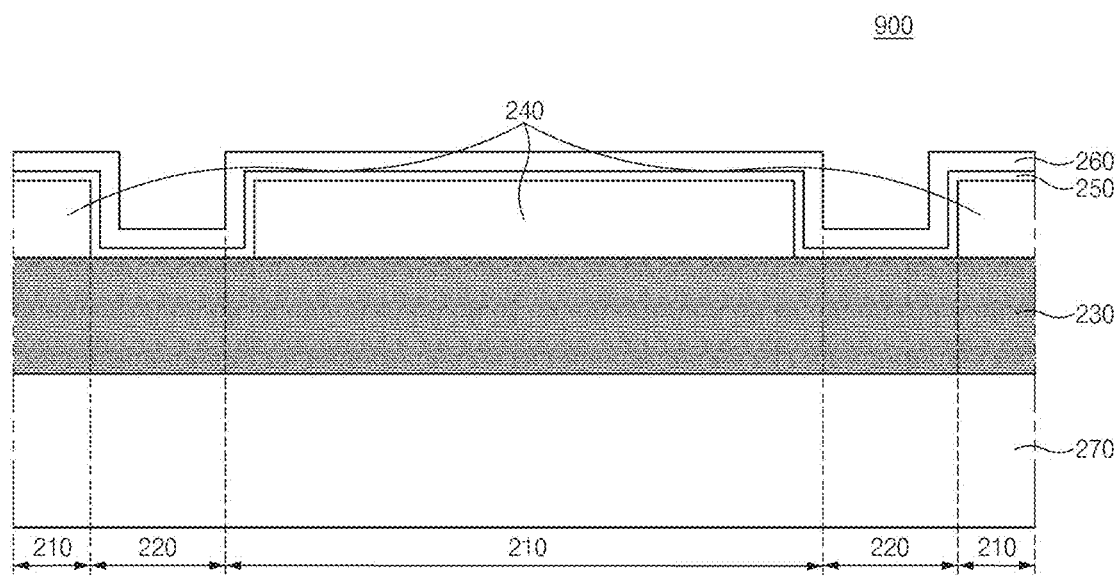
FIG. 9 is a diagram illustrating an embodiment of a cross-section taken along a third cutting line illustrated in FIG. 4.

FIG. 9 is a diagram illustrating an embodiment of a cross-section taken along the line C-C' illustrated in FIG. 4.

The cross-section structure 900 of the image sensor includes a region between the fifth pixel P5 and the eighth pixel P8. The following descriptions, however, can be applied to regions between other unit pixels included in the pixel array 110.

The cross-section structure 900 of the image sensor may include the substrate 270, the metal layer 230, the air layer 240, the first capping layer 250 and the second capping layer 260. In addition, the cross-section 900 may further include the color filter 300, the over coating layer 310 and the micro lens 320, which have been described with reference to FIG. 5. The color filter 300, the over coating layer 310 and the micro lens 320 are omitted in FIG. 9.

The first grid 210 may be extended along one side of the unit pixel P5 or P8 abutting the first grid 210. The first grid 210 may be additionally disposed in a region where the first extension region of the pixel array 110-3 and the second extension region of the pixel array 110-3 cross each other. The first grid 210 may be disposed in the center of the unit pixels (for example, P4, P5, P7 and P8) disposed in a 2×2 matrix.

The first grid 210 which is not present in FIG. 7 but additionally disposed in FIG. 9 may function to prevent light incident in a diagonal direction from the lens module (not illustrated) located over the micro lens 320 from propagating into another unit pixel through the vertex of another unit pixel. Thus, the additionally disposed first grid 210 can improve the optical crosstalk performance of the image sensor.

The first grid 210 disposed in the center of FIG. 9 may have a length equal to or less than that of one side of the corresponding unit pixel P5 or P8. The first grids 210 disposed on the left and right sides of the first grid 210 disposed in the center and the first grid 210 disposed in the center may not abut each other but be spaced apart from each other.

The air layer 240 of the first grid 210 may be physically isolated from another first grid 210 adjacent thereto by the gap regions 220 disposed on the left and right sides of the first grid 210. The gap region 220 may include the metal layer 230 and the first and second capping layers 250 and 260 that are sequentially stacked on the metal layer 230 while the air layer 240 is omitted in the gap region 220. Thus, the gap region 220 may be referred to as a second grid and the second grid includes the metal layer 230.

In some implementations, each of the first grid 210 and the gap region 220 may not include the metal layer 230.

The air layer 240 of the first grid 210 illustrated in FIG. 9 is physically separated into predetermined units (for example, one unit per side of unit pixel and one unit per intersection) by the gap region 220 which does not include the air layer 240. Therefore, the amount of pressure applied to the weak point of the first and second capping layers 250 and 260 can be reduced to the volume of one separated air layer 240 of the first grid 210 instead of the volume of the entire air layers included in the pixel array 110. Thus, the pressure applied to the weak point can be distributed to effectively prevent the occurrence of the damage of the first grid.

FIGS. 10A to 10K are diagrams for describing a process of forming a grid structure based on an embodiment.

FIGS. 10A to 10G are cross-sectional views corresponding to the cross-section taken along the third cutting line C-C' of FIG. 2A. Referring to FIGS. 10A to 10K, a process of forming the first grid 210 and the gap region 220 which are illustrated in FIG. 7 will be described below, the first grid 210 including the metal layer 230 and formed as one body along one side of the unit pixel. The grid structures illustrated in FIGS. 8 and 9 are formed by substantially the same process as the process for forming the grid structure illustrated in FIG. 7, except the shape of a mask pattern 280 which defines the first grid 210. In the below, the descriptions will be focused on the differences.

Figure 10A:
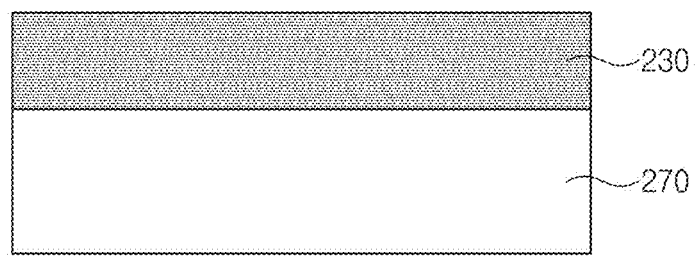
Figure 10B:
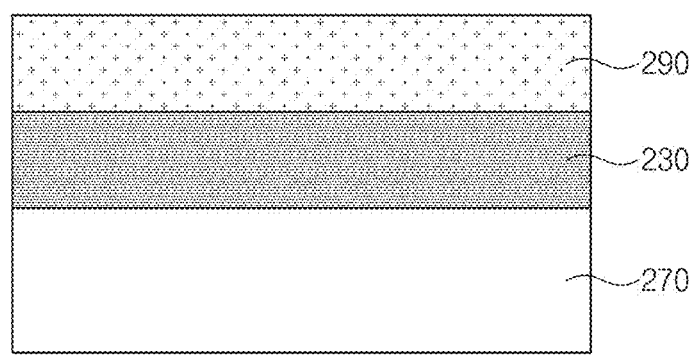

Referring to FIG. 10A, the metal layer 230 may be formed on the substrate 270 through a deposition process. The height of the metal layer 230 may correspond to the height of the metal layer 230 of the gap region 220 and the first grid 210. For example, the substrate 270 may include a P-type or N-type bulk substrate, a substrate obtained by growing a P-type or N-type epitaxial layer in a P-type bulk substrate, or a substrate obtained by growing a P-type or N-type epitaxial layer in an N-type bulk substrate.

When the metal layer 230 is formed, a first mask pattern (not illustrated) defining the first grid 210 and the gap region 220 may be disposed over the metal layer 230, and the metal layer 230 corresponding to the first grid 210 and the gap region 220 may be formed by etching the metal layer 230 using the first mask pattern as an etch mask. The etch depth of the metal layer 230 may be decided based on the height of the metal layer 230 included in the first grid 210 in advance. Mask patterns including the first mask pattern (not illustrated), which will be described below, may include photoresist patterns.

When the etch process for the metal layer 230 is performed, the metal layer 230 may be removed from the light receiving region of each unit pixel. Then, the first mask pattern may be removed.

Referring to FIG. 1013, a sacrificial layer 290 may be formed on the metal layer 230 and the substrate 270. The sacrificial layer 290 may include an SOC (Spin On Carbon) layer containing carbon. The height of the sacrificial layer 290 over the metal layer 230 may be equal to the height of the first grid 210. For this structure, an additional process may be performed to match the height of the sacrificial layer 290 with the height of the first grid 210.

Figure 10C:
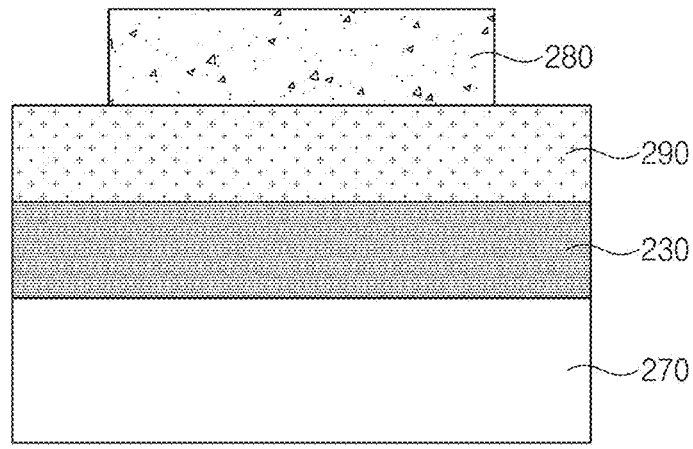

Referring to FIG. 10C, a second mask pattern 280 defining the first grid 210 may be disposed on the sacrificial layer 290.

Figure 10D:
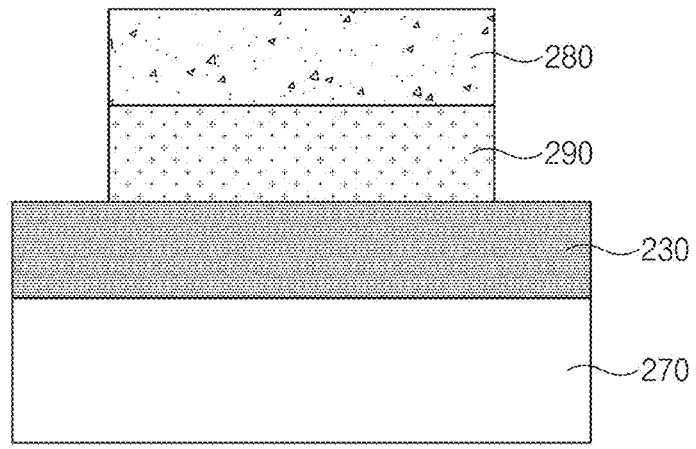

Referring to FIG. 10D, the sacrificial layer 290 may be etched using the second mask pattern 280 as an etch mask. Thus, the sacrificial layer 290 disposed in regions from which the first grid 210 is excluded (for example, the gap region and the light receiving region of the unit pixel) may be removed.

After the sacrificial layer 290 is removed, the second mask pattern 280 may be removed. When the process of FIG. 10D is completed, the sacrificial layer 290 corresponding to the shape of the air layer 240 included in the first grid 210 may be completely formed.

Figure 10E:
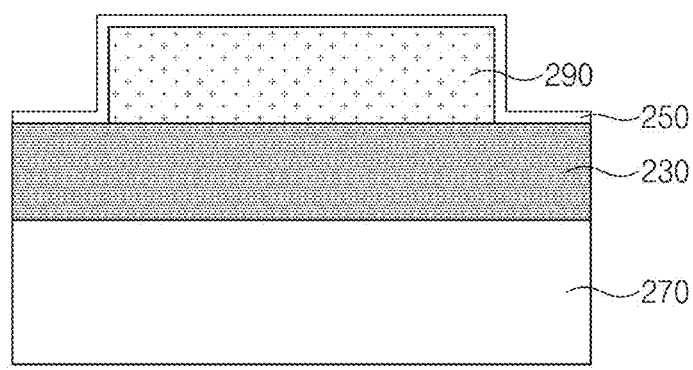

Referring to FIG. 10E, the first capping layer 250 may be formed over the substrate 270, the sacrificial layer 290 and the metal layer 230 through a deposition process. The first capping layer 250 may include oxide, for example, ULTO. The first capping layer 250 may have a thickness that molecules produced by bonding between gas used in a subsequent plasma process and carbon of the sacrificial layer 290 can easily escape to the outside. For example, the first capping layer 250 may have a thickness of 300 Å or less.

Figure 10F:
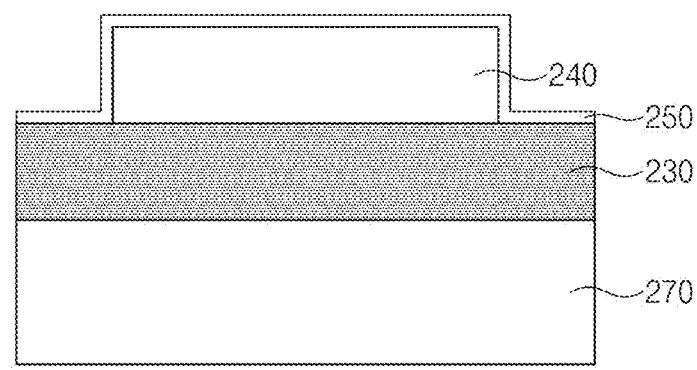

Referring to FIG. 10F, a plasma process may be performed after the first capping layer 250 is formed. Thus, the sacrificial layer 290 may be removed, and the air layer 240 may be formed at a position corresponding to the sacrificial layer 290. The plasma process may be performed using gas such as $O_2$, $N_2$, $H_2$, CO, $CO_2$ and $CH_4$, which includes one or more of oxygen, nitrogen and hydrogen. Here, an $O_2$ plasma process will be taken as an example for describing the plasma process in more detail. During the $O_2$ plasma process, oxygen radicals O* are introduced into the sacrificial layer 290 through the first capping layer 250, and then bonded to carbon of the sacrificial layer 290 to produce CO or $CO_2$. The produced CO or $CO_2$ escapes to the outside through the first capping layer 250. Through such a process, the sacrificial layer 290 may be removed, and the air layer 240 may be formed at the position where the sacrificial layer 290 has been removed.

In an embodiment, in order to prevent a collapse of the first capping layer 250 even when the sacrificial layer 290 is removed, the plasma process may be performed with a support layer (not illustrated) such as an oxide layer formed on the sacrificial layer 290.

Figure 10G:
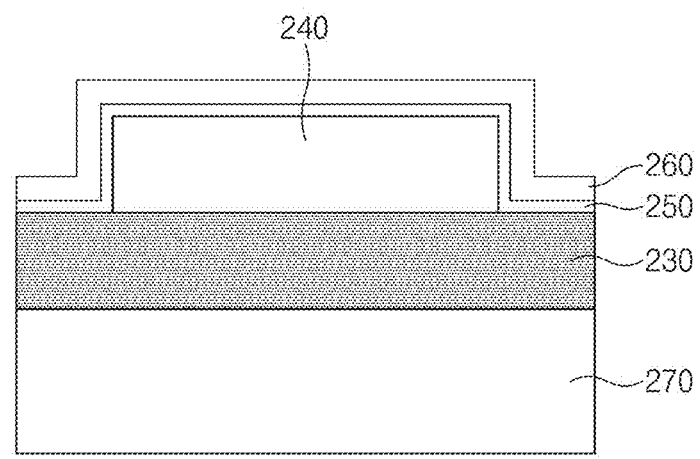

Referring to FIG. 10G, the second capping layer 260 may be formed on the first capping layer 250 through a deposition process, after the plasma process is performed. For example, the second capping layer 260 may be or include a dielectric layer including one or more of silicon oxynitride ($Si_xO_yN_z$), silicon oxide ($Si_xO_y$) and silicon nitride ($Si_xN_y$) where x, y and z are natural numbers. The second capping layer 260 may have a thickness which is larger than that of the first capping layer 250 and required for stably maintaining the shape of the first grid 210. When the process corresponding to FIG. 10G is completed, the first grid 210 and the second grid of the gap region 220 may be completely formed.

Figure 10H:
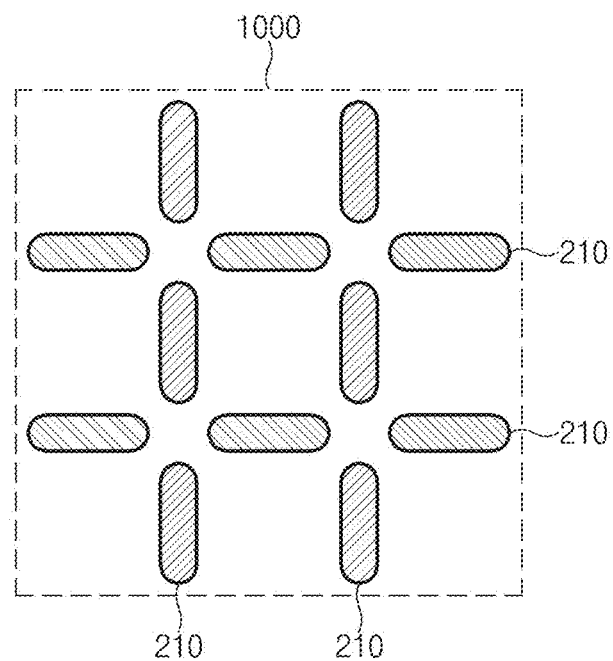
Figure 101:
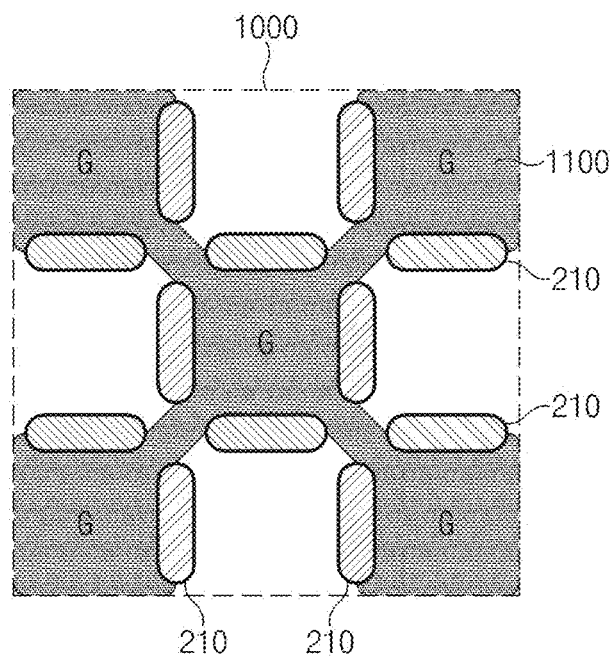

FIG. 10H is a plan view schematically illustrating the pixel array 110-1A after the first grid 210 is formed. In FIG. 10H, a pixel region 1000 is a region corresponding to the first to ninth pixels P1 to P9 illustrated in FIG. 2A. The first grid 210 may be disposed between adjacent pixels among the first to ninth pixels P1 to P9.

The first to ninth pixels P1 to P9 may be arranged according to a bayer pattern. That is, a pixel group arranged in a random 2×2 matrix within the pixel array 110-1A may include two green pixels G disposed in a diagonal direction, one red pixel R and one blue pixel B. The green pixel G, the red pixel R and the blue pixel B may include a green color filter to pass only a wavelength corresponding to green, a red color filter to pass only a wavelength corresponding to red, and a blue color filter to pass only a wavelength corresponding to blue, respectively.

Referring to FIG. 10I, green color filters 1100 may be formed in the first, third, fifth, seventh and ninth pixels P1, P3, P5, P7 and P9 corresponding to the green pixels G among the first to ninth pixels P1 to P9. The green color filter 1100 may be formed through a dyeing process, a pigment dispersion process, a printing process and the like. For example, the green color filter 1100 may be formed by applying a photosensitive material such as dyed photoresist and performing an exposure and development process.

The height of the green color filter 1100 may be equal to or smaller than the height of the first grid 210. Furthermore, the green color filters 1100 included in the green pixels G adjacent to each other in a diagonal direction may be connected to each other and formed as one body.

Figure 10J:
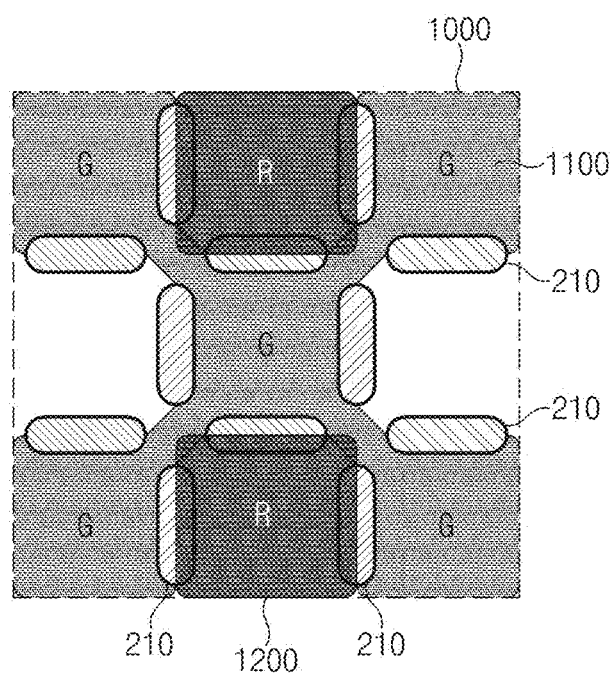

Referring to FIG. 10J, red color filters 1200 may be formed in the second and eighth pixels P2 and P8 corresponding to the red pixels R among the first to ninth pixels P1 to P9. The red color filters 1200 may be formed by performing a gap-fill process on the second and eighth pixels P2 and P8.

The height of the red color filter 1200 may be equal to or larger than the height of the first grid 210. Therefore, as illustrated in FIG. 10J, the red color filter 1200 may cover at least a part of the upper area of the first grid 210, due to the characteristic of the gap-fill process.

Figure 10K:
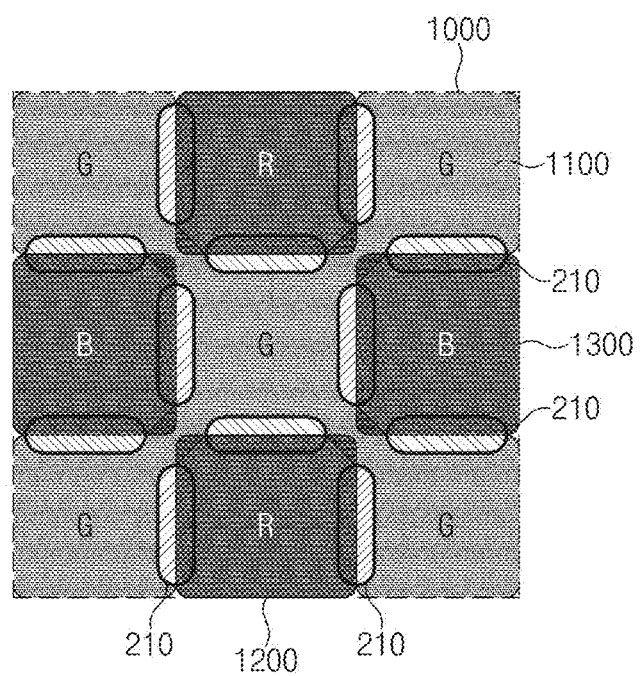

Referring to FIG. 10K, blue color filters 1300 may be formed in the fourth and sixth pixels P4 and P6 corresponding to the blue pixels B among the first to ninth pixels P1 to P9. The blue color filters 1300 may be formed by performing a gap-fill process on the fourth and sixth pixels P4 and P6.

The height of the blue color filter 1300 may be equal to or larger than the height of the first grid 210. Therefore, as illustrated in FIG. 10K, the blue color filter 1300 may cover at least a part of the upper area of the first grid 210, due to the characteristic of the gap-fill process.

In the present embodiment, it has been described that the process of forming the red color filters 1200 in FIG. 10J is first performed, and the process of forming the blue color filters 1300 in FIG. 10K is then performed. In accordance with another embodiment, however, the process of forming the blue color filters 1300 may be first performed, and the process of forming the red color filters 1200 may be then performed.

After the green color filters 1100, the red color filters 1200 and the blue color filters 1300 are completely formed as illustrated in FIG. 10K, a planarized layer such as the over coating layer 310 may be formed over the color filters 1100, 1200 and 1300. Although FIGS. 5 to 7 illustrate that the color filters 300 have the same height and do not cover the top surface of the first grid 210, this is only an embodiment. As described above, the green color filter 1100, the red color filter 1200 and the blue color filter 1300 may have different heights, and each of the red color filter 1200 and the blue color filter 1300 may cover at least a part of the top surface of the first grid 210.

Then, the micro lens 320 may be formed over the over coating layer 310. For example, the micro lens 320 may be formed through a process of forming patterns corresponding to the respective pixels P1 to P9 using light transmitting photoresist, and reflowing the patterns such that the patterns have a predetermined curvature and are convex in the direction that incident light is provided.

In some embodiments, the pressure applied to a weak point of the air grid can be distributed to effectively prevent popping at the weak point.

It is understood that various embodiments and terminology used herein are not intended to limit technical ideas described in this document to specific embodiments, but rather to include various modifications, equivalents, and/or alternatives of the embodiments. Wherever possible, the same reference numbers will be used throughout the drawings to refer to the same or like portions.

The embodiments of the disclosed technology may provide a variety of effects capable of being directly or indirectly recognized through the above-mentioned patent document.

Although a number of illustrative embodiments of the disclosed technology have been described, it should be understood that other modifications and embodiments can be devised by those skilled in the art.

What is claimed is:

1. An image sensor comprising:
a plurality of first grid structures arranged in rows and columns of a pixel array including imaging pixels arranged in rows and columns, the plurality of first grid structures structured to separate the imaging pixels from one another and including a low refractive-index material or air to provide an optical isolation between two adjacent imaging pixels; and
a gap region disposed between two adjacent first grid structures of the plurality of first grid structures and configured to physically isolate the low refractive-index material or the air of the two adjacent first grid structures from each other,
wherein the plurality of first grid structures comprise a first capping layer covering the low refractive-index material or the air.

2. The image sensor of claim 1, wherein each of the plurality of first grid structures extends along a side of a unit pixel of the pixel array.

3. The image sensor of claim 1, wherein the gap region includes two portions that extend along a row direction and a column direction, respectively.

4. The image sensor of claim 1, wherein the pixel array includes four unit pixels arranged in a (2×2) matrix and at least one of the plurality of first grid structures is disposed at a center of the four unit pixels.

5. The image sensor of claim 1, wherein the gap region is free of the air.

6. The image sensor of claim 1, further comprising color filters disposed between the two adjacent first grid structures.

7. The image sensor of claim 6, wherein the color filters include a red color filter and a blue color filter disposed to cover at least a part of a first grid structure.

8. The image sensor of claim 6, wherein the color filters include one or more green color filters and the one or more green color filters are disposed in a diagonal direction and adjacent to one another.

9. The image sensor of claim 1, wherein a height of the gap region is shorter than a height of the plurality of first grid structures.

10. The image sensor of claim 9, wherein the first capping layer has a refractive index higher than the low refractive-index material or the air and lower than a color filter disposed adjacent to the first capping layer.

11. The image sensor of claim 9, wherein the plurality of first grid structures further comprise a second capping layer covering the first capping layer and having a larger thickness than a thickness of the first capping layer.

12. The image sensor of claim 1, wherein the plurality of first grid structures further comprise a metal layer including a metal and located under the air.

13. The image sensor of claim 1, wherein a first capping layer and a second capping layer are disposed under a color filter disposed above a photodiode in each unit pixel in the pixel array.

14. The image sensor of claim 1, wherein a first capping layer and a second capping layer are disposed over a metal in the gap region.

15. The image sensor of claim 14, wherein the metal includes tungsten.

16. The image sensor of claim 1, wherein each of the plurality of first gird structures includes segments each including a surface with a rounded rectangular shape.

17. An image sensor, comprising:
unit pixels arranged in rows and columns, each including a photosensing element and configured to generate electronic signals in response to a reception of light incident on each of unit pixels;
a metal layer formed along boundaries of each of the unit pixels to surround unit pixels; and
one or more structures disposed on the metal layer and spaced apart from one another, each of the one or more structure including a refractive-index material that has sufficiently low refractive-index to block light incident on a corresponding unit pixel from passing through toward neighboring unit pixels,
wherein each of the one or more structure includes a void region filled with air.

18. The image sensor of claim 17, wherein the one or more structures are disposed on sides of the unit pixels.

19. The image sensor of claim 17, wherein at least one of the one or more structures is disposed at a center of four unit pixels that are arranged in a (2×2) matrix.

20. An image sensor, comprising:
unit pixels arranged in rows and columns, each including a photosensing element and configured to generate electronic signals in response to a reception of light incident on each of unit pixels;
a metal layer formed along boundaries of each of the unit pixels to surround unit pixels; and
one or more structures disposed on the metal layer and spaced apart from one another, each of the one or more structure including a refractive-index material that has sufficiently low refractive-index to block light incident on a corresponding unit pixel from passing through toward neighboring unit pixels, and
wherein at least one of the one or more structure is disposed at a center of four unit pixels that are arranged in a (2×2) matrix.

21. An image sensor comprising:
one or more first grid structures disposed on a substrate having a top surface and a bottom surface opposite to the top surface and arranged in rows and columns of a pixel array including imaging pixels arranged in rows and columns, the one or more first grid structures structured to separate the imaging pixels from one another and including a low refractive-index material or air to provide an optical isolation between two adjacent imaging pixels and the one or more first grid structures located on the top surface of the substrate and spaced apart from the bottom surface of the substrate; and
a gap region disposed over the top surface of the substrate and between the two adjacent first grid structures and configured to physically isolate the two adjacent first grid structures from each other,
wherein the one or more first grid structures comprise a first capping layer covering the low refractive-index material or the air.

* * * * *